United States Patent
Lee

(10) Patent No.: US 9,559,234 B2
(45) Date of Patent: Jan. 31, 2017

(54) SOLAR CELL APPARATUS

(71) Applicant: LG INNOTEK CO., LTD., Seoul (KR)

(72) Inventor: Dong Keun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/389,088

(22) PCT Filed: Mar. 27, 2013

(86) PCT No.: PCT/KR2013/002560
§ 371 (c)(1),
(2) Date: Sep. 29, 2014

(87) PCT Pub. No.: WO2013/147516
PCT Pub. Date: Oct. 3, 2013

(65) Prior Publication Data
US 2015/0101666 A1     Apr. 16, 2015

(30) Foreign Application Priority Data
Mar. 27, 2012  (KR) .................. 10-2012-0031243

(51) Int. Cl.
| | |
|---|---|
| H01L 31/00 | (2006.01) |
| H01L 31/042 | (2014.01) |
| H02N 6/00 | (2006.01) |
| H01L 31/054 | (2014.01) |
| H02S 40/22 | (2014.01) |
| H01L 31/048 | (2014.01) |

(52) U.S. Cl.
CPC ........ H01L 31/0543 (2014.12); H01L 31/048 (2013.01); H02S 40/22 (2014.12); Y02E 10/50 (2013.01); Y02E 10/52 (2013.01)

(58) Field of Classification Search
CPC ...... H01L 31/0543; H02S 40/22; Y02E 10/50; Y02E 10/52
USPC .......... 136/244, 246, 251, 252, 259
See application file for complete search history.

(56) References Cited

U.S. PATENT DOCUMENTS

| | | |
|---|---|---|
| 2006/0109682 A1 | 5/2006 | Ko et al. |
| 2008/0231960 A1 | 9/2008 | Van Gorkom et al. ....... 359/634 |
| 2009/0205699 A1* | 8/2009 | Chang ................ H01L 31/0543 136/246 |
| 2010/0116319 A1 | 5/2010 | Martinez Anton et al. .. 136/246 |

(Continued)

FOREIGN PATENT DOCUMENTS

| | | |
|---|---|---|
| CN | 1779522 | 5/2006 |
| CN | 101078783 | 11/2007 |

(Continued)

OTHER PUBLICATIONS

International Search Report dated Aug. 23, 2013 issued in Application No. PCT/KR2013/002560.

(Continued)

*Primary Examiner* — Lindsey Bernier
(74) *Attorney, Agent, or Firm* — KED & Associates, LLP

(57) ABSTRACT

Disclosed is a solar cell apparatus. The solar cell apparatus includes a substrate including a transmission area and a non-transmission area extended in one direction, respectively, and disposed in parallel to each other, a solar cell disposed in the non-transmission area, and a refractive part provided in the transmission area and refracting at least a portion of an incident light to the non-transmission area.

7 Claims, 3 Drawing Sheets

(56) References Cited

U.S. PATENT DOCUMENTS

2010/0200044 A1   8/2010   Zaban et al. .................. 136/246
2012/0187439 A1   7/2012   Bösch et al. .................... 257/98

FOREIGN PATENT DOCUMENTS

| CN | 102013445 | 4/2011 |
|---|---|---|
| CN | 102176478 | 9/2011 |
| JP | 2005-340583 A | 8/2005 |
| TW | M318670 | 9/2007 |
| TW | M336414 | 7/2008 |
| WO | WO 2011-009580 A1 | 1/2011 |

OTHER PUBLICATIONS

Chinese Office Action dated Jul. 27, 2016. (English translation).

* cited by examiner

SOLAR CELL APPARATUS

CROSS-REFERENCE TO RELATED PATENT APPLICTIONS

This application is a U.S. National Stage Application under 35 U.S.C. §371 of PCT Application No. PCT/KR2013/002560, filed Mar. 27, 2013, which claims priority to Korean Patent Application No. 10-2012-0031243, filed Mar. 27, 2012, whose entire disclosures are hereby incorporated by reference.

TECHNICAL FIELD

The embodiment relates to a solar cell apparatus.

BACKGROUND ART

Solar cell apparatuses to convert the solar light into electrical energy include solar cells panels, diodes, and frames.

The solar cell panel has the shape of a plate. For example, the solar cell panel has the shape of a rectangular plate. The solar cell panel is provided inside the frame. Four lateral sides of the solar cell panel are provided inside the frame.

The solar cell panel receives the solar light and converts the solar light into the electrical energy. The solar cell panel includes a plurality of solar cells. In addition, the solar cell panel may further include a substrate, a film, or a protective glass to protect the solar cells.

In addition, the solar cell panel includes bus bars coupled to the solar cells. The bus bars are extended on the top surface of the outermost solar cells so that the bus bars are connected to wirings, respectively.

The diode is connected to the solar cell panel in parallel. Current selectively flows through the diode. In other words, when the performance of the solar cell panel is deteriorated, current flows through the diode. Therefore, the solar cell apparatus according to the embodiment can be prevented from being shorted. In addition, the solar cell apparatus may further include wirings connected to the diode and the solar cell panel. The wirings are connected to solar cell panels adjacent to each other.

The frame receives the solar cell panel. The frame includes metal. The frame is provided at the lateral side of the solar cell panel. The frame receives the lateral sides of the solar cell panel. In addition, the frame may include a plurality of sub-frames. In this case, the sub-frames may be connected to each other.

The solar cell apparatus is installed in the outdoor field to convert the solar light into the electrical energy. In this case, the solar cell apparatus may be exposed to the physical impact, the electrical impact, and the chemical impact occurring in the outside.

The technology related to the solar cell apparatus is disclosed in Korean Unexamined Patent Publication No. 10-2009-0059529.

DISCLOSURE OF INVENTION

Technical Problem

The embodiment provides a solar cell apparatus having a wide lighting area.

Solution to Problem

According to the embodiment, there is provided a solar cell apparatus including a substrate including a transmission area and a non-transmission area extended in one direction, respectively, and provided in parallel to each other, a solar cell provided in the non-transmission area, and a refractive part provided in the transmission area and refracting at least a portion of an incident light to the non-transmission area.

Advantageous Effects of Invention

As described above, according to the solar cell apparatus of the embodiment, the refractive part is provided in the transmission area. Accordingly, the light incident into the transmission area is refracted to the non-transmission area through the refractive part.

In detail, the light refracted by the refractive part is output to the lower portion of the substrate and the non-transmission area.

Therefore, the solar cell apparatus according to the embodiment can supply light to both of the transmission area and the non-transmission area. In other words, when the solar cell apparatus according to the embodiment is used as a window, the solar cell apparatus according to the embodiment can supply the light to both of the transmission area and the non-transmission area.

Accordingly, the solar cell apparatus according to the embodiment can supply light to the non-transmission area having the solar cells, as well as the transmission area, so that the solar cell apparatus may have a wide lighting area.

MODE FOR THE INVENTION

Figure 1:
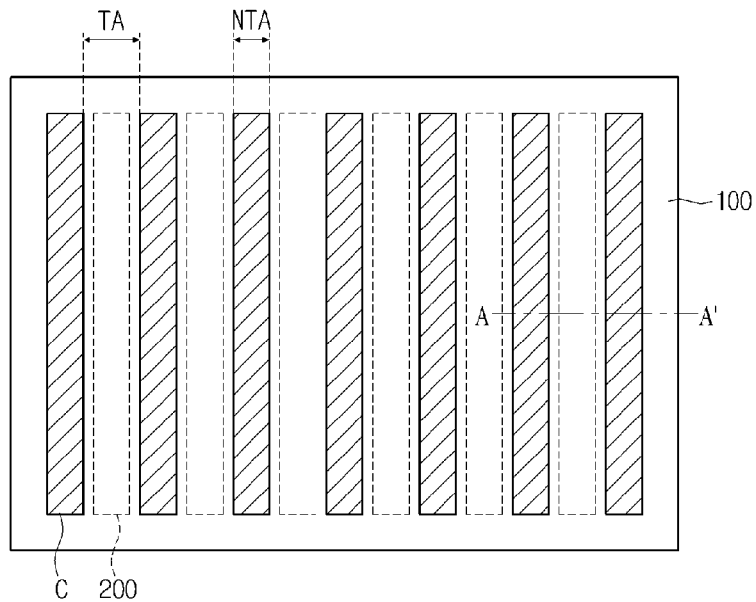
FIG. 1 is a plan view showing a solar cell apparatus according to one embodiment.

In the following description of the embodiments, it will be understood that, when a panel, a bar, a frame, a substrate, a recess, or a film is referred to as being "on" or "under" another panel, bar, frame, substrate, recess, or film, it can be "directly" or "indirectly" on the other panel, bar, frame, substrate, recess, or film, or one or more intervening layers may also be present. Such a position of the element described with reference to the drawings. The thickness and size of each element shown in the drawings may be exaggerated, omitted or schematically drawn for the purpose of convenience or clarity. In addition, the size of elements does not utterly reflect an actual size.

Figure 2:
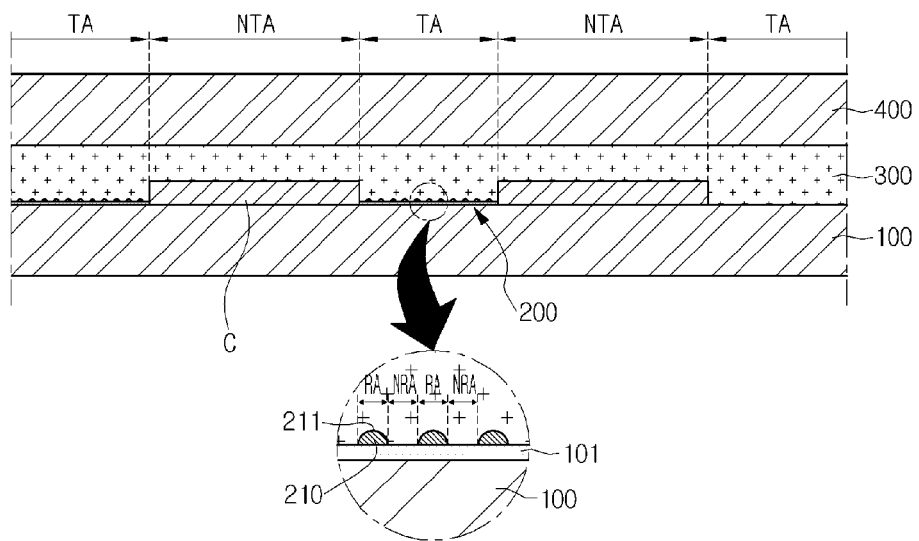
FIG. 2 is a sectional view taken along line A-A' of FIG. 1.
Figure 3:
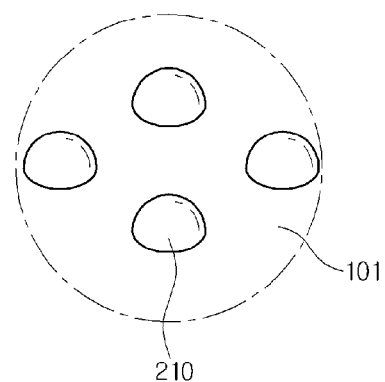
FIG. 3 is a view showing one shape of a refractive part.
Figure 4:
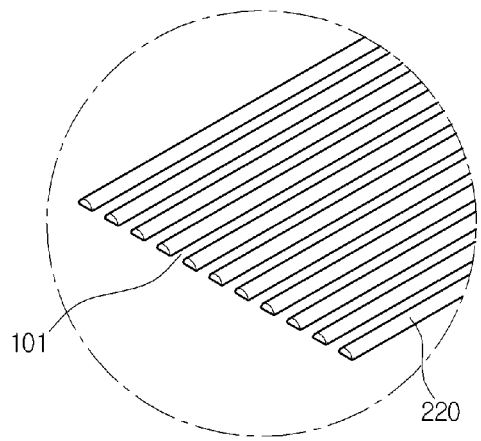
FIG. 4 is a view showing one shape of a refractive part.
Figure 5:
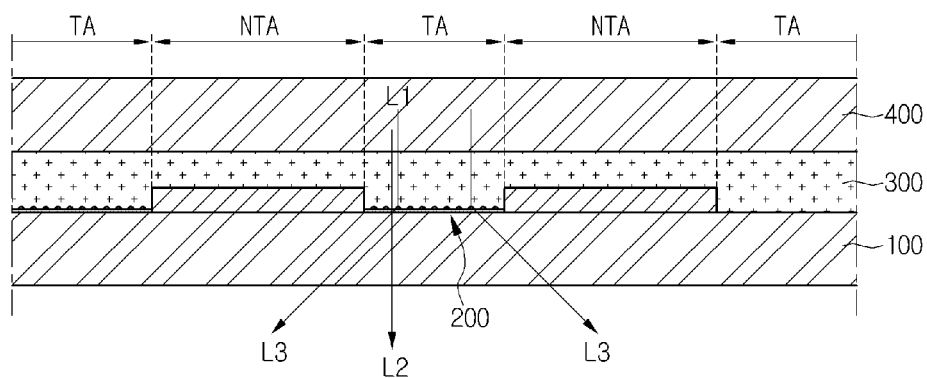
FIG. 5 is a sectional view showing the process in which light is incident into a transmission area.
Figure 6:
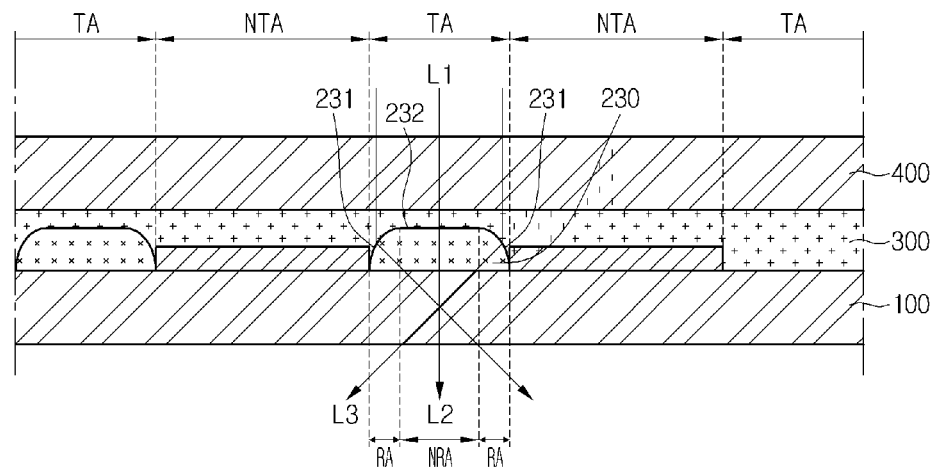
FIG. 6 is a sectional view showing a solar cell apparatus according to another embodiment.
Figure 7:
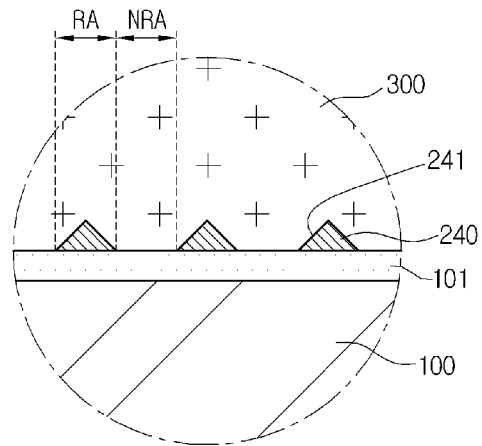
FIG. 7 is a sectional view showing a solar cell apparatus according to still another embodiment.
Figure 8:
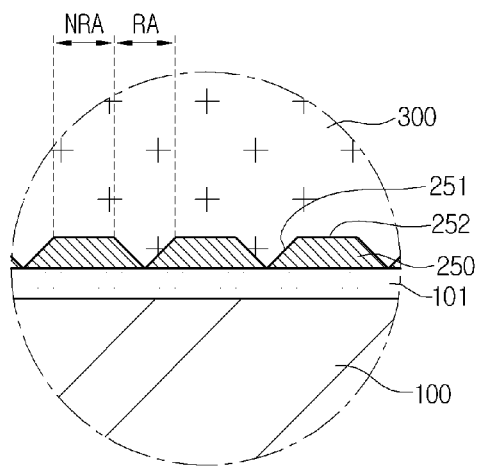
FIG. 8 is a view showing a solar cell apparatus according to still another embodiment.
Figure 9:
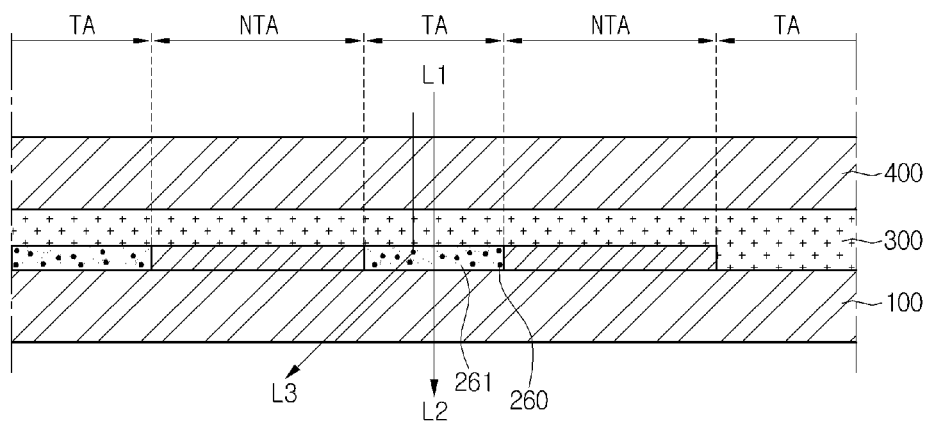
FIG. 9 is a sectional view showing a solar cell apparatus according to still another embodiment.

FIG. 1 is a plan view showing a solar cell apparatus according to one embodiment. FIG. 2 is a sectional view taken along line A-A' of FIG. 1. FIG. 3 is a view showing one shape of a refractive part. FIG. 4 is a view showing one shape of a refractive part. FIG. 5 is a sectional view showing the process in which light is incident into a transmission area. FIG. 6 is a sectional view showing a solar cell apparatus according to another embodiment. FIG. 7 is a sectional view showing a solar cell apparatus according to still another embodiment. FIG. 8 is a view showing a solar cell apparatus according to still another embodiment. FIG. 9 is a sectional view showing a solar cell apparatus according to still another embodiment.

Referring to FIGS. 1 to 9, a solar cell apparatus according to the embodiment includes a support substrate 100, a plurality of solar cells C, a plurality of refractive parts 200, a buffer sheet 300, and a protective substrate 400.

The support substrate 100 has a plate shape, and supports the solar cells C and the refractive parts 200.

The support substrate 100 may be an insulator. The support substrate 100 may be a glass substrate or a metal substrate. In detail, the support substrate 100 may be a soda lime glass substrate. The support substrate 100 may be transparent. The support substrate 100 may be rigid or flexible.

The solar cells C are disposed on the support substrate 100. In detail, the solar cells C are disposed on a top surface of the support substrate 100. In more detail, the solar cells C may be directly disposed on the top surface of the support substrate 100.

The solar cells C are extended in a first direction. The solar cells C are extended in parallel to each other. The solar cells C are spaced apart from each other by a predetermined interval. In other words, the solar cells C may be provided in the form of a stripe.

The solar cells C may convert incident sunlight into electrical energy. The solar cells C may be connected to each other in parallel. In detail, the solar cells C may be connected to each other in parallel through a first bus bar and a second bus bar.

For example, the solar cells C may include a CIGS solar cell, a silicon-based solar cell, a dye-sensitized solar cell, a group II-VI compound semiconductor solar cell, or a group III-V compound semiconductor solar cell.

In more detail, each of the solar cells C may include a back electrode, a light absorbing part, a buffer, a high resistance buffer, and a front electrode.

The back electrode is provided on the support substrate 100. The back electrode is a conductive layer. For example, a material used for the back electrode may include metal such as molybdenum (Mo).

The back electrode may include at least two layers. In this case, at least two layers may include using the same metal or different metals.

The light absorbing part is provided on the back electrode. The light absorbing part may include group I-III-VI compounds. For instance, the light absorbing part may include the Cu (In,Ga)Se$_2$ (CIGS) crystal structure, the Cu(In)Se$_2$ crystal structure, or the Cu(Ga)Se$_2$ crystal structure.

The energy band gap of the light absorbing part may be in the range of about 1 eV to 1.8 eV.

The buffer is provided on the light absorbing part. The buffer directly makes contact with the light absorbing part. The buffer may include cadmium sulfide (CdS). The buffer may have the energy bandgap in the range of about 1.9 eV to about 2.3 eV.

The high-resistance buffer is disposed on the buffer. The high-resistance buffer includes i-ZnO, which is not doped with impurities. The high-resistance buffer may have the energy bandgap in the range of about 3.1 eV to about 3.3 eV.

The front electrode may be provided on the light absorbing part. In detail, the front electrode is provided on the high-resistance buffer.

The front electrode is disposed on the high-resistance buffer. The front electrode is transparent. For example, a material used for the front electrode may include an aluminum doped zinc oxide (AZO), an indium zinc oxide (IZO), or an indium tin oxide (ITO).

The front electrode may have a thickness in the range of about 500 nm to about 1.5 μm. In addition, if the front electrode includes AZO, aluminum (Al) may be doped with the content of about 2.5 wt % to about 3.5 wt %. The front electrode is a conductive layer.

In addition, each solar cell C may include sub-solar cells C connected to each other in series.

A plurality of transmission areas TA and a plurality of non-transmission areas NTA are defined in the support substrate 100 by the solar cells C. On the support substrate 100, the transmission areas TA and the non-transmission areas NTA are extended in a first direction. In addition, the transmission areas TA and the non-transmission areas NTA are arranged in parallel to each other.

The transmission areas TA are interposed between the solar cells C. The solar cells C are not disposed at the transmission areas TA. Light is transmitted through the transmission areas TA.

The non-transmission areas NTA correspond to the solar cells C. In other words, the solar cells C are disposed at the non-transmission areas NTA, respectively. Light is not transmitted through the non-transmission areas NTA.

The transmission areas TA may be alternately arranged with the non-transmission areas NTA. The transmission areas TA and the non-transmission areas NTA may have a shape extended in the first direction. In other words, the transmission areas TA and the non-transmission areas NTA may be provided adjacent to each other while being provided in parallel to each other.

In addition, a first bus bar may be disposed at one end of the solar cells C, and a second bus bar may be disposed at an opposite end of the solar cells C.

The first bust bar is extended in a direction crossing the solar cells C. The first bus bar is extended in a second direction crossing the first direction. The first bus bar may be disposed corresponding to the one end of the solar cells C.

The first bus bar is connected to the solar cells C. In detail, the first bus bar is coupled to the solar cells C. In more detail, the first bus bar is coupled to back electrodes of the solar cells C. The first bus bar is coupled to the solar cells C through parts of the back electrodes exposed to the outside. The first bus bar may directly make contact with the back electrodes. In detail, the first bus bar may be directly bonded to an exposed top surface of the back electrodes of the solar cells C through a solder process.

The first bus bar is connected to one end of the solar cells C. The first bus bar may be extended to a rear surface of the support substrate 100 through a hole which is formed at the support substrate 100.

The second bus bar is extended in a direction crossing the solar cells C. The second bus bar is extended in the second direction crossing the first direction. The second bus bar may be disposed corresponding to an opposite end of the solar cells C.

The second bus bar is connected to the solar cells C. In detail, the second bus bar is coupled to the solar cells C. In more detail, the second bus bar is coupled to front electrodes of the solar cells C. The second bus bar is coupled to the solar cells C through connection electrodes and a coupling part. The second bus bar may directly make contact with the connection electrodes. In detail, the second bus bar may be directly bonded to an exposed top surface of the connection electrodes through the solder process.

The second bus bar is connected to one end of the solar cells C. The second bus bar may be extended to a rear surface of the support substrate 100 through the hole which is formed in the support substrate 100.

The first bus bar and the second bus bar include a conductor. The first bus bar and the second bus bar may be a metal ribbon. The first bus bar and the second bus bar may include a conductive paste. The first bus bar and the second bus bar may be a conductive tape.

The refractive parts 200 are disposed on the support substrate 100. The refractive parts 200 are disposed on the top surface of the support substrate 100. The reflection-transmission parts 200 may be directly disposed on the top surface of the support substrate 100.

The refractive parts 200 are disposed at the transmission areas TA, respectively. The refractive parts 200 may be disposed throughout the whole area of the transmission areas TA. In other words, each refractive part 200 may longitudinally be extended in the first direction. The refractive parts 200 are interposed between the solar cells C. In addition, the refractive parts 200 are disposed aside the solar cells C. The refractive parts 200 may be aligned on the same plane with the solar cells C. The refractive parts 200 are disposed adjacent to the solar cells C. The refractive parts 200 and the solar cells C are alternately disposed.

The refractive parts 200 may refract at least a portion of light incident into the transmission areas TA. For instance, the refractive parts 200 may refract the portion of the light incident into the transmission areas TA, and may transmit a remaining portion of the light. In detail, the refractive part 200 may refract only a portion of the light to change the path of the light. In this case, the refractive part 200 may refract the portion of the light, which is incident into the transmission areas TA, to the non-transmission areas NTA, and may transmit the remaining portion of the light to the transmission areas TA.

The refractive parts 200 may output the light incident into the transmission areas TA to the lower portion of the support substrate 100 and the non-transmission areas NTA by changing a portion of the light incident into the transmission areas TA. In other words, a portion of light incident into the transmission areas TA and the protective substrate 400 is directed toward the non-transmission areas NTA and the lower portion of the support substrate 100 by the refractive parts 200.

In addition, the refractive parts 200 may output another portion of the light, which is incident into the transmission areas TA, to the lower portion of the support substrate 100 and the transmission areas TA without changing the path of the another portion of the light incident into the transmission areas TA. In other words, the another portion of the light incident into the transmission areas TA and the protective substrate 400 is not refracted, but directed to the non-transmission areas NTA and the lower portion of the support substrate 100.

As shown in FIGS. 2 to 5, the refractive parts 200 include a plurality of lenses 210. The lenses 210 are spaced apart from each other. In other words, the transmission area TA may be divided into areas having the lenses 210 and areas without the lenses 210.

In more detail, the transmission area TA may include a refractive area RA and a non-refractive area NRA.

The path of light incident into the refractive area RA is changed due to the refraction. Light incident into the non-refractive area NRA is not refractive, but transmitted. In this case, the areas having the lenses 210 may be the refractive areas RA, and the areas without the lenses 210 may be the non-refractive areas NRA in the transmission areas TA.

Each lens 210 includes a refractive surface 211. The refractive surface 211 is extended in a second direction crossing the first direction. The refractive surface 211 may be inclined with respect to the top surface of the support substrate 100. The refractive surface 211 may include a curved surface. In more detail, the entire portion of the refractive surface 211 may be curved.

As shown in FIG. 3, the lenses 210 may have the shape of a convex lens. In other words, the lenses 210 may be grid-arrayed in the transmission areas TA. Alternatively, as shown in FIG. 4, the lenses 210 may have the shape of a Lenticular lens. In other words, the lenses 210 may be extended in the first direction while being arranged in parallel to each other. The lenses 210 may have a shape that is convex from the top surface of the support substrate 100.

The width or the diameter of each lens 210 may be in the range of about 1 μm to about 50 μm. The interval between the lenses 210 may be in the range of about 1 μm to about 50 μm. The height of each lens 210 may be in the range of about 0.5 μm to about 25 μm.

The lenses 210 include transparent resin. In detail, the lenses 210 may include resin having a refractive index different from that of the buffer sheet 300. The refractive index of the lens 210 may be 0.1 times greater than or less than the refractive index of the buffer sheet 300. The lenses 210 may in clued photo-curable resin or thermo-setting resin. Alternatively, the lenses 210 may include thermoplastic resin.

The lenses 210 may be formed through a stepping process. In other words, the lenses 210 may be formed through an engraved mold.

In addition, the lenses 210 may adhere to the top surface of the support substrate 100 by an adhesive layer 101. The adhesive layer 101 may be formed throughout the entire portion of the transmission area TA. For instance, the adhesive layer 101 may include a photo-curable material. The adhesive layer 101 may be transparent.

The lenses 210 may be disposed on a top surface of the adhesive layer 101. The lenses 219 may adhere to the top surface of the adhesive layer 101. The lenses 210 may adhere to the support substrate 100 through the adhesive layer 101.

Alternatively, the lenses 210 may be directly disposed on the top surface of the support substrate 100. In other words, the lenses 210 may directly make contact with the top surface of the support substrate 100 without the adhesive layer 101.

As shown in FIG. 6, at least one lens 230 may be disposed throughout the entire portion of each transmission area TA. In other words, the lens 230 may cover the entire portion of the transmission area TA. In this case, the lens 230 may include a refractive surface 231 and a non-refractive surface 232. In this case, in the transmission area TA, an area having the refractive surface 231 may be the refractive area RA, and an area having the non-refractive surface 232 may be a non-refractive area.

The refractive surface 231 may be inclined with respect to the top surface of the support substrate 100. The refractive surface 231 may be a curved surface. The light incident into the transmission area TA is refracted through the refractive surface 231, so that the path of the light may be changed.

The non-refractive surface 232 may be extended from the refractive surface 231. The non-refractive surface 232 may be disposed in opposition to the top surface of the support substrate 100. In detail, the non-refractive surface 232 may be substantially parallel to the top surface of the support substrate 100. In more detail, the angle between the non-refractive surface 232 and the support substrate 100 may be in the range of about 0° to about 1.5°.

The non-refractive surface 232 may include a flat surface. The entire portion of the non-refractive surface 232 may be flat.

The refractive area RA may be defined by the area in which the refractive surface 231 is provided. In addition, the non-refractive area NRA may be defined by the area in which the non-refractive surface 232 is provided. The area of the non-refractive area NRA may be in the range of ⅓ to ⅔ of the area of the transmission area TA.

As shown in FIG. 7, the refractive part 200 may include lenses 240 having the shape of a poly-pyramid or the shape of a mountain. The refractive surface 241 of each lens 240 includes a flat surface. The direction of the light refracted by the refractive part 200 may be adjusted by properly adjusting the angle between the refractive surface 241 and the top surface of the support substrate 100.

Referring to FIG. 8, both of a refractive surface 251 and a non-refractive surface 252 of at least one lens 250 may be flat surfaces. In addition, each lens 210 may be provided at the entire portion of the transmission area TA.

Referring to FIG. 9, each refractive part 200 may include a plurality of scattering particles 260. The refractive part 200 may further include a resin 261 adhering to the top surface of the support substrate 100, and the scattering particles 260 may be dispersed in the resin 261.

The path of the light passing between the scattering particles 260 is not changed. The path of the light incident into the scattering particles 260 is changed, so that the light incident into the scattering particles 260 may be directed to the non-transmission area NTA.

The buffer sheet 300 is disposed on the solar cells C and the refractive part 200. The buffer sheet 300 is disposed on the support substrate 100 while covering the solar cells C and the refractive part 200.

The buffer sheet 300 is transparent and has elasticity. The buffer sheet 300 may include ethylenevinylacetate (EVA) resin.

The buffer sheet 300 is interposed between the support substrate 100 and the protective substrate 400. The buffer sheet 300 may perform a mechanical buffer function and an optical buffer function between the support substrate 100 and the protective substrate 400.

The protective substrate 400 is disposed on the buffer sheet 300. The protective substrate 400 is provided in opposition to the support substrate 100. The protective substrate 400 protects the solar cells C. The material used for the protective substrate 400 may include a tempered glass.

The protective substrate 400 closely makes contact with the top surface of the support substrate 100 through the buffer sheet 300. In other words, the protective substrate 400 may be laminated on the top surface of the support substrate 100 through the buffer sheet 300.

As shown in FIG. 5, a portion L of light L1 incident into the transmission areas TA through the protective substrate 400 is refracted by the refractive part 200. In addition, another portion L2 of the light L1 incident into the transmission areas TA through the protective substrate 400 is not refracted, but transmitted. The light L3 incident into the refractive area RA is refracted, so that the path of the light L3 may be changed. In other words, the path of the light L3 incident into the refractive area RA is changed so that the light L3 incident into the refractive area RA may be output to the non-refractive area NTA and the lower portion of the support substrate 100. In addition, the light incident into the non-refractive area NRA may pass through the non-refractive area NRA.

In other words, a portion of light incident into the transmission area TA is refracted to the non-transmission area NTA by the refractive part 200. In detail, the light refracted by the refractive part 200 is output to the non-transmission area NTA and the support substrate 100.

Therefore, the solar cell apparatus according to the embodiment can supply light to both of the transmission area TA and the non-transmission area NTA. In other words, when the solar cell apparatus according to the embodiment is used as a window, the solar cell apparatus according to the embodiment can supply the light to both of the transmission area TA and the non-transmission area NTA.

Therefore, the solar cell apparatus according to the embodiment can supply light to the non-transmission area NTA having the solar cells C, as well as the transmission area TA, so that the solar cell apparatus may have a wide lighting area.

In particular, the solar cell apparatus according to the embodiment can properly adjust the inclined angles of the refractive surfaces 211, 231, 241, and 251. Accordingly, the solar cell apparatus according to the embodiment can easily adjust the intensity of light supplied to the non-transmission area NTA.

In addition, according to the solar cell apparatus of the embodiment, an external landscape can be viewed through the non-refractive area NRA. In other words, the solar cell apparatus according to the embodiment is used as a window to supply the whole indoor lighting while allowing the external landscape to be viewed indoors.

Further, the features, structures, and effects described in the above embodiments are included in at least one embodiment of the present invention, and are not necessarily limited to only one embodiment. Moreover, the features, structures, and effects described in the embodiments may also be combined or modified to be carried out in other embodiments by those skilled in the art to which the embodiments pertain. Thus, the contents related to the combination and modification shall be construed to be included in the scope of the present invention.

Although the embodiments have been mainly described until now, they are just exemplary and do not limit the present invention. Thus, those skilled in the art to which the present invention pertains will know that various modifications and applications which have not been exemplified may be carried out within a range which does not deviate from the essential characteristics of the embodiments. For example, the constituent elements described in detail in the exemplary embodiments can be modified to be carried out. Further, the differences related to such modifications and applications shall be construed to be included in the scope of the present invention specified in the attached claims.

The invention claimed is:

1. A solar cell apparatus comprising:
   a substrate including a transmission area, a first non-transmission area and a second non-transmission area extending in a first direction, and provided in parallel to each other, wherein the transmission area is between the first non-transmission area and the second non-transmission area;
   a first solar cell provided in the form of a stripe directly on a top surface of the first non-transmission area of the substrate, wherein the first solar cell is only located on the first non-transmission area of the substrate; and a second solar cell provided in the form of a stripe directly on a top surface of the second non-transmission area of the substrate, wherein the second solar cell is only located on the second non-transmission area of the substrate; and a refractive part provided on a top surface of the transmission area of the substrate, wherein the refractive part is only located on the transmission area of the substrate and wherein the refractive part refracts at least a portion of an incident light to the first or second non-transmission areas of the substrate; and wherein the refractive part includes a plurality of spaced apart lenses, wherein the plurality of lenses are between the first solar cell and the second solar cell, and wherein the first solar cell, the second solar cell and the plurality of lenses are coplanar.

2. The solar cell apparatus of claim 1, wherein each of the plurality of lenses includes a curved surface.

3. The solar cell apparatus of claim 1, wherein each of the plurality of lenses includes a flat surface.

4. The solar cell apparatus of claim 1, wherein each of the plurality of lenses includes a refractive surface.

5. The solar cell apparatus of claim 4, wherein the plurality of lenses are arranged in a form of a lattice on the transmission area.

6. The solar cell apparatus of claim 4, wherein the plurality of lenses extend in the first direction while being provided in parallel to each other.

7. The solar cell apparatus of claim 1, further including:
a buffer sheet provided on the first and second solar cells and the refractive part on the substrate; and
a protective substrate on the buffer sheet.

* * * * *